United States Patent
Wang

(10) Patent No.: US 11,463,100 B1
(45) Date of Patent: Oct. 4, 2022

(54) DIGITAL-TO-ANALOG CONVERTER AND DIGITAL-TO-ANALOG CONVERSION METHOD THEREOF

(71) Applicant: REALTEK SEMICONDUCTOR CORP., Hsinchu (TW)

(72) Inventor: Chih-Chiang Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/406,907

(22) Filed: Aug. 19, 2021

(30) Foreign Application Priority Data

Mar. 25, 2021 (TW) .................................. 110110943

(51) Int. Cl.
*H03M 1/06* (2006.01)
*H03M 1/66* (2006.01)
*H03M 1/08* (2006.01)

(52) U.S. Cl.
CPC ............. *H03M 1/662* (2013.01); *H03M 1/08* (2013.01)

(58) Field of Classification Search
CPC ............. H03M 1/0863; H03M 1/0604; H03M 1/0624; H03M 1/0881; H03M 1/66; H03M 1/742; H03M 1/747; H03M 1/785; H03M 1/0607; H03M 1/0641; H03M 1/0818; H03M 1/0872; H03M 1/1009; H03M 1/1215; H03M 1/1255; H03M 1/145; H03M 1/38; H03M 1/46; H03M 1/502; H03M 1/687; H03M 1/74; H03M 1/745; H03M 3/348

USPC .................................. 341/144–154, 118–120
See application file for complete search history.

(56) References Cited

U.S. PATENT DOCUMENTS

| | | | | |
|---|---|---|---|---|
| 6,476,748 B1* | 11/2002 | Galton | ................ | H03M 1/0675 341/68 |
| 7,042,379 B2* | 5/2006 | Choe | .................... | H03M 1/0881 341/144 |
| 8,138,822 B1* | 3/2012 | Cyrusian | ................. | G05F 1/561 327/157 |
| 8,493,253 B2* | 7/2013 | Tseng | .................. | H03M 1/0641 341/145 |
| 9,287,888 B2 | 3/2016 | Chiang et al. | | |
| 9,350,377 B1* | 5/2016 | Fetche | ................ | H03M 1/0863 |
| 10,778,240 B1* | 9/2020 | Wang | .................. | H03M 1/0818 |
| 2004/0223567 A1* | 11/2004 | Liu | ......................... | H04L 7/007 375/355 |

(Continued)

FOREIGN PATENT DOCUMENTS

| | | |
|---|---|---|
| TW | I536745 B | 6/2016 |
| TW | I681638 B | 1/2020 |

*Primary Examiner* — Linh V Nguyen
(74) *Attorney, Agent, or Firm* — Birch, Stewart, Kolasch & Birch, LLP

(57) ABSTRACT

A digital-to-analog converter and a digital-to-analog conversion method thereof are provided. The digital-to-analog conversion method includes: converting a digital data signal into an analog data signal in a first cycle according to a clock signal, resetting the analog data signal in a second cycle according to the clock signal and a reset signal corresponding to a first reset level, and compensating for a voltage level of the reset analog data signal in the second cycle according to a second reset level, so that the voltage level of the reset analog data signal is the second reset level. The second reset level is higher or lower than the first reset level.

20 Claims, 7 Drawing Sheets

(56) References Cited

U.S. PATENT DOCUMENTS

2005/0258992 A1* 11/2005 Fontaine ............... H03M 1/662
  341/144
2016/0191033 A1* 6/2016 Lee ..................... H03M 1/0607
  341/118

* cited by examiner

| RZA | 1 | 1 | 0 | 0 | 1 |
|---|---|---|---|---|---|
| RZB | 0 | 0 | 1 | 1 | 1 |
| D[1] | 1 | 0 | 0 | 0 | 1 |
| RZA | 1 | 1 | 0 | 0 | 1 |
| RZB | 0 | 0 | 1 | 1 | 1 |
| D[2] | 0 | 1 | 1 | 0 | 1 |
| RZA | 1 | 1 | 0 | 0 | 1 |
| RZB | 0 | 0 | 1 | 1 | 1 |
| D[3] | 1 | 1 | 0 | 1 | 1 |

FIG. 5

DIGITAL-TO-ANALOG CONVERTER AND DIGITAL-TO-ANALOG CONVERSION METHOD THEREOF

CROSS-REFERENCE TO RELATED APPLICATION

This non-provisional application claims priority under 35 U.S.C. § 119(a) to Patent Application No. 110110943 filed in Taiwan, R.O.C. on Mar. 25, 2021, the entire contents of which are hereby incorporated by reference.

BACKGROUND

Technical Field

The present disclosure relates to a digital-to-analog converter, and in particular, to a digital-to-analog converter providing a compensation voltage during return-to-zero conversion.

Related Art

Electronic products are often affected by adverse effects such as: noise, idle tones, and the like during operation, causing a failure of the electronic products to implement expected operation, which affects experience of users, and severely, affects original functions of the electronic products. For example, for audio products such as microphones and speakers, even when no sound is inputted to the audio products, the audio products may be affected by idle tones at a specific frequency to produce sound output, causing users to hear the sound output produced by speakers even when the users produce no sound, and the audio products cannot operate normally either. Therefore, the adverse effects such as noise and idle tones significantly affect operation of electronic products.

SUMMARY

In some embodiments, a digital-to-analog converter includes a digital-to-analog conversion circuit and a compensation circuit. The digital-to-analog conversion circuit configured to receive a clock signal, a digital data signal, and a reset signal corresponding to a first reset level, convert the digital data signal into an analog data signal in a first cycle according to the clock signal, and reset the analog data signal in a second cycle according to the clock signal and the first reset level. The compensation circuit is coupled to the digital-to-analog conversion circuit and is configured to compensate for a voltage level of the reset analog data signal in the second cycle according to a second reset level, so that the voltage level of the reset analog data signal is the second reset level. The second reset level is higher or lower than the first reset level.

In some embodiments, a digital-to-analog conversion method includes: receiving a digital data signal in a first cycle according to a clock signal, converting the digital data signal into an analog data signal in a first cycle, resetting the analog data signal in a second cycle according to the clock signal and a reset signal corresponding to a first reset level, and compensating for a voltage level of the reset analog data signal in the second cycle according to a second reset level, so that the voltage level of the reset analog data signal is the second reset level. The second reset level is higher or lower than the first reset level.

BRIEF DESCRIPTION OF THE DRAWINGS

FIG. 5 is a schematic diagram of an embodiment of a reset signal and a digital data signal according to the present disclosure.

DETAILED DESCRIPTION

Figure 1:
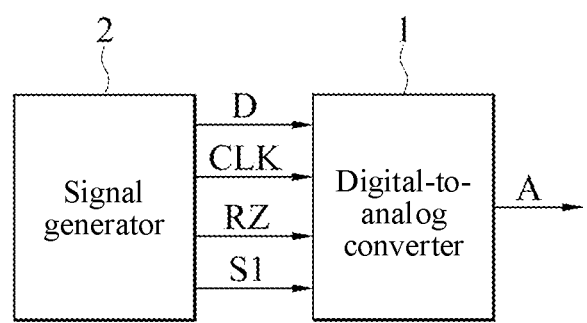
FIG. 1 is a schematic block diagram of some embodiments in which a digital-to-analog converter is coupled to a signal generator according to the present disclosure.

FIG. 1 is a schematic block diagram of some embodiments of a digital-to-analog converter 1 according to the present disclosure. Referring to FIG. 1, the digital-to-analog converter 1 may be coupled to a signal generator 2. The signal generator 2 may generate a digital data signal D. The digital data signal D may include any number of bits (such as 1 bit, 2 bits, or more than 3 bits), and the signal generator 2 may generate a clock signal CLK, a reset signal RZ, and a compensation input signal S1. The signal generator 2 may send the digital data signal D, the clock signal CLK, the reset signal RZ, and the compensation input signal S1 to the digital-to-analog converter 1. According to different levels of the clock signal CLK, the digital-to-analog converter 1 may perform the digital-to-analog conversion of the digital data signal D, or may perform return-to-zero conversion according to the compensation input signal S1 and the reset signal RZ. The digital-to-analog converter 1 performs the digital-to-analog conversion and the return-to-zero conversion to generate an analog data signal A having a corresponding voltage level.

Figure 2:
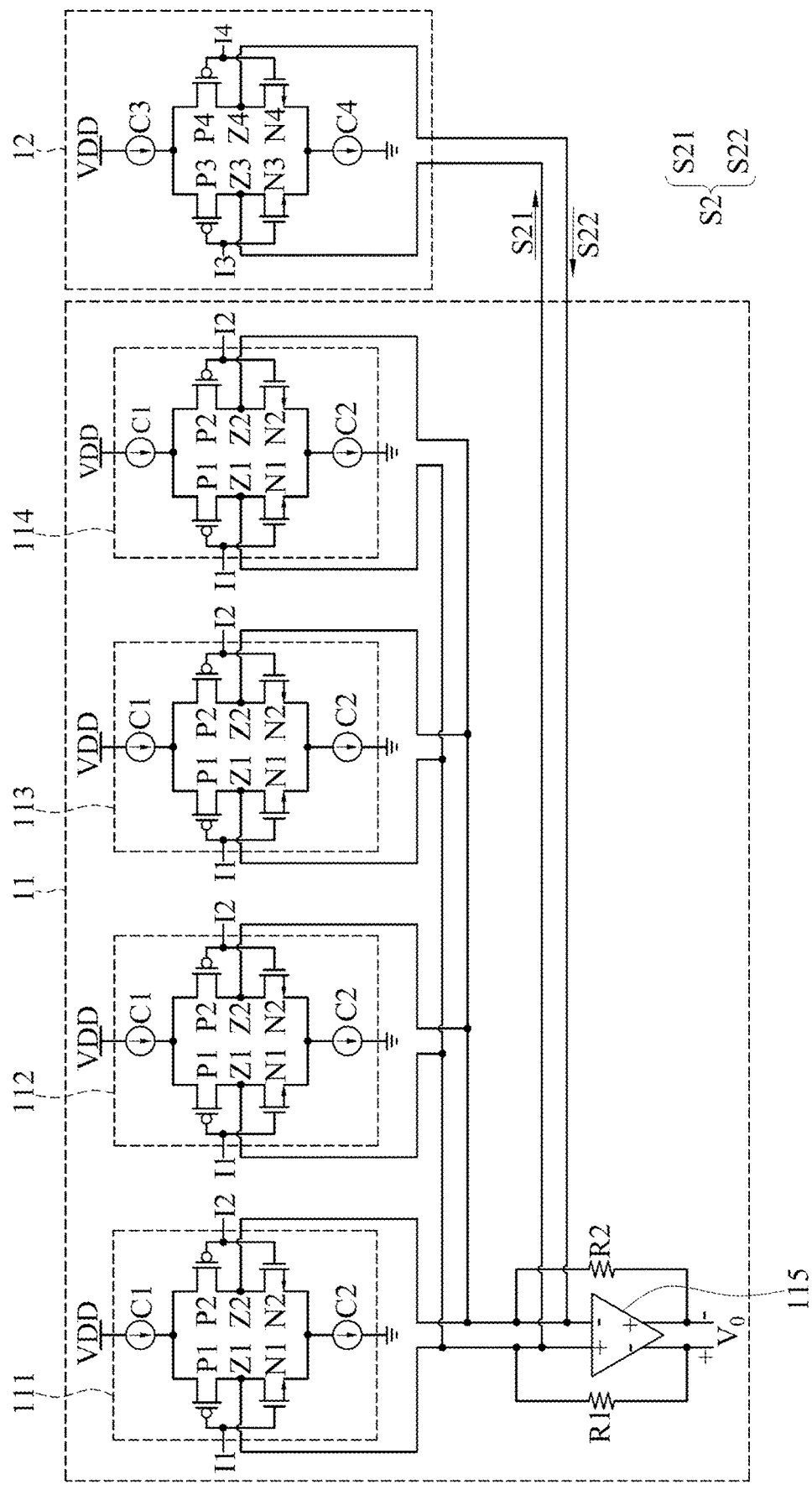
FIG. 2 is a schematic circuit diagram of an embodiment in which the digital-to-analog converter of FIG. 1 operates in a second cycle.
Figure 3:
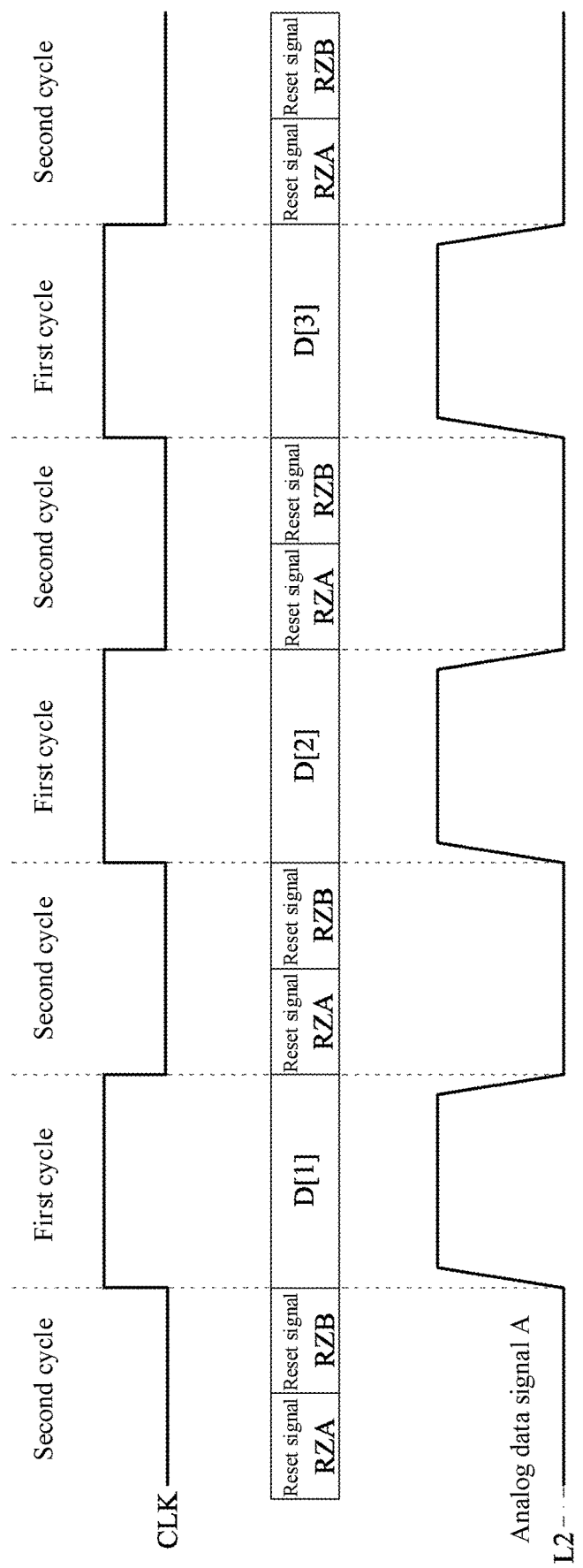
FIG. 3 is a waveform diagram of an embodiment in which the digital-to-analog converter of FIG. 1 performs digital-to-analog conversion and return-to-zero conversion.

As shown in FIG. 2, the digital-to-analog converter 1 may include a digital-to-analog conversion circuit 11 and a compensation circuit 12. The digital-to-analog conversion circuit 11 is coupled to the compensation circuit 12. The digital-to-analog conversion circuit 11 may receive the digital data signal D and the reset signal RZ, and the compensation circuit 12 may receive the compensation input signal S1. Referring to FIG. 1 to FIG. 3 together, according to the clock signal CLK, the digital-to-analog conversion circuit 11 may receive the digital data signal D in a cycle (which is referred to as a first cycle below) in which the clock signal CLK is at a first level, and the digital-to-analog conversion circuit 11 converts the digital data signal D into an analog data signal A having a corresponding voltage level. In addition, the digital-to-analog conversion circuit 11 may receive the reset signal RZ in a cycle (which is referred to as a second cycle below) in which the clock signal CLK is at a second level, and the digital-to-analog conversion circuit 11 performs return-to-zero conversion of the analog data signal A according to a reset level L1 (which is referred to as a first reset level L1 below) corresponding to the reset signal RZ.

Further, in the second cycle, the compensation circuit 12 may receive the compensation input signal S1, and the compensation circuit 12 generates a compensation output signal S2 according to the compensation input signal S1. The compensation output signal S2 may include compensation currents S21 and S22. The compensation output signal S2 may be used to compensate for the voltage level of the analog data signal A during the return-to-zero conversion. In other words, by virtue of the compensation output signal S2 generated by the compensation circuit 12, the digital-to-analog converter 1 may generate an analog data signal A having a relatively high reset level L2 (which is referred to as a second reset level L2 below) through the return-to-zero conversion. A voltage level of the compensated and reset analog data signal A is at the second reset level L2. In addition, as shown in FIG. 3, the second reset level L2 is higher than the above first reset level L1. In another embodiment, the second reset level L2 is lower than the above first reset level L1.

Based on this, the compensation circuit 12 may compensate for the voltage level of the reset analog data signal A according to the relatively high reset level during the return-to-zero conversion, that is, the digital-to-analog converter 1 may perform return-to-zero conversion on the analog data signal A according to the relatively high reset level, so that the reset analog data signal A is at the high reset level. In this way, the analog data signal A has an offset voltage. According to different product applications, for example, when the digital-to-analog converter 1 is applied to an audio product, an idle tone generated by a digital-to-analog converter 1 having a relatively high offset voltage is beyond an audio range audible to human ears (for example, an audio range greater than 20 KHz). In this way, human ears do not hear audio output generated when the audio product receives no audio.

In some embodiments, for example, the digital data signal D includes at least four bits. Referring to FIG. 2 and FIG. 3 together, the digital-to-analog conversion circuit 11 may include four current units 111, 112, 113, 114, an amplifier circuit 115, and feedback resistors R1, R2. The current units 111-114 are coupled to an input terminal of the amplifier circuit 115. Each of the current units 111-114 includes input terminals I1, I2, current sources C1, C2, transistor switches P1, P2, and transistor switches N1, N2. The transistor switches P1, P2 may be P-type transistors, and the transistor switches N1, N2 may be N-type transistors. The current source C1 is coupled to the source of the transistor switch P1 and the source of the transistor switch P2. The current source C2 is coupled to the source of the transistor switch N1 and the source of the transistor switch N2, the drain of the transistor switch P1 is coupled to the drain of the transistor switch N1, and the drain of the transistor switch P2 is coupled to the drain of the transistor switch N2. In addition, a connection point Z1 between the each of transistor switches P1 and each of the transistor switches N1 is coupled to one of the input terminals of the amplifier circuit 115, and a connection point Z2 between each of the transistor switches P2 and each of the transistor switches N2 is coupled to the other of the input terminals of the amplifier circuit 115. The feedback resistors R1, R2 are coupled between the input terminals and an output terminal of the amplifier circuit 115.

Based on this, in the first cycle, each of the input terminals I1 of the current units 111-114 may receive one of bits of the digital data signal D, and each of the input terminals I2 may receive an inverted signal of the bit received by each of the input terminals I1. For example, the input terminal I1 of the current unit 111 may receive the first bit of the digital data signal D, and the input terminal I2 of the current unit 111 may receive an inverted signal of the first bit of the digital data signal D. The input terminal I1 of the current unit 112 may receive the second bit of the digital data signal D, and the input terminal I2 of the current unit 112 may receive an inverted signal of the second bit of the digital data signal D. The input terminal I1 of the current unit 113 may receive the third bit of the digital data signal D, and the input terminal I2 of the current unit 113 may receive an inverted signal of the third bit of the digital data signal D. The input terminal I1 of the current unit 114 may receive the fourth bit of the digital data signal D, and the input terminal I2 of the current unit 114 may receive an inverted signal of the fourth bit of the digital data signal D.

Therefore, the signals received by the input terminals I1, I2 have opposite polarities. When the bit of the digital data signal D received by each of the input terminals I1 is "0", the transistor switches P1, N2 are on, and the transistor switches P2, N1 are off. A current signal provided by the current source C1 forms a current path between the transistor switch P1, the connection point Z1, the input terminal of the amplifier circuit 115, the feedback resistor R1, and the output terminal of the amplifier circuit 115 and forms a corresponding voltage drop on the feedback resistor R1, and a current signal provided by the current source C2 forms a current path between the output terminal of the amplifier circuit 115, the feedback resistor R2, the input terminal of the amplifier circuit 115, the connection point Z2, and the transistor switch N2 and forms a corresponding voltage drop on the feedback resistor R2, to generate a voltage V0 at the output terminal of the amplifier circuit 115. The voltage V0 is the above analog data signal A. In addition, when the bit of the digital data signal D received by each of the input terminals I1 is "1", the transistor switches P2, N1 are on, and the transistor switches P1, N2 are off. A current signal provided by the current source C2 forms a current path between the transistor switch N1, the connection point Z1, the input terminal of the amplifier circuit 115, the feedback resistor R1, and the output terminal of the amplifier circuit 115 and forms a corresponding voltage drop on the feedback resistor R1. And a current signal provided by the current source C1 forms a current path between the output terminal of the amplifier circuit 115, the feedback resistor R2, the input terminal of the amplifier circuit 115, the connection point Z2, and the transistor switch P2 and forms a corresponding voltage drop on the feedback resistor R2. According to the voltage drops formed on the feedback resistors R1, R2 by the current units 111-114 according to the digital data signal D, the output terminal of the amplifier circuit 115 generates a corresponding analog data signal A (that is, V0 in the figure).

Similarly, in the second cycle, the input terminals I1 of the current units 111-114 each may receive one of bits of the reset signal RZ, and the input terminals I2 each receive an inverted signal of the bit received by each of the input terminals I1. The transistor switches P1, P2, N1, N2 of the current units 111-114 are then turned on or turned off according to the bits of the reset signal RZ being "1" or "0" to form the above current path, so that current signals provided by the current sources C1, C2 flow through the feedback resistors R1, R2, and the output terminal of the amplifier circuit 115 generates a corresponding analog data signal A (that is, V0 in the figure) accordingly. Details are not described herein again.

In some embodiments, for example, the compensation input signal S1 is a 1-bit digital signal. The compensation circuit 12 may include a current unit, and the current unit of the compensation circuit 12 may have the same circuit structure as each of the current units 111-114. As shown in FIG. 2, the compensation circuit 12 may include input terminals I3, I4, current sources C3, C4, transistor switches P3, P4, and transistor switches N3, N4. The current source C3 is coupled to the source of the transistor switch P3 and the source of the transistor switch P4. The current source C4 is coupled to the source of the transistor switch N3 and the source of the transistor switch N4. The drain of the transistor switch P3 is coupled to the drain of the transistor switch N3, and the drain of the transistor switch P4 is coupled to the drain of the transistor switch N4. A connection point Z3 between the transistor switch P3 and the transistor switch N3 is coupled to one of the input terminals of the amplifier circuit 115, and a connection point Z4 between the transistor switch P4 and the transistor switch N4 is coupled to the other of the input terminals of the amplifier circuit 115.

In the second cycle, the input terminal I3 of the compensation circuit 12 may receive the compensation input signal S1, such as the compensation input signal S1 having a logic level of "1", and the input terminal I4 receives an inverted signal of the compensation input signal S1, such as "0". The transistor switches P4, N3 are on, and the transistor switches P3, N4 are off. A current signal provided by the current source C4 forms a compensation current S21 on a current path between the transistor switch N3, the connection point Z3, the input terminal of the amplifier circuit 115, the feedback resistor R1, and the output terminal of the amplifier circuit 115 and the compensation current S21 forms a corresponding voltage drop on the feedback resistor R1, and a current signal provided by the current source C3 forms a compensation current S22 on a current path between the output terminal of the amplifier circuit 115, the feedback resistor R2, the input terminal of the amplifier circuit 115, the connection point Z4, and the transistor switch P4 and the compensation current S22 forms a corresponding voltage drop on the feedback resistor R2 (that is, a compensation voltage used to compensate for the first reset level L1). According to a total voltage drop formed through the digital compensation input signal S1 on the feedback resistors R1, R2, the output terminal of the amplifier circuit 115 generates the analog data signal A (that is, V0 in the figure) at the second reset level L2 in the second cycle.

Figure 4:
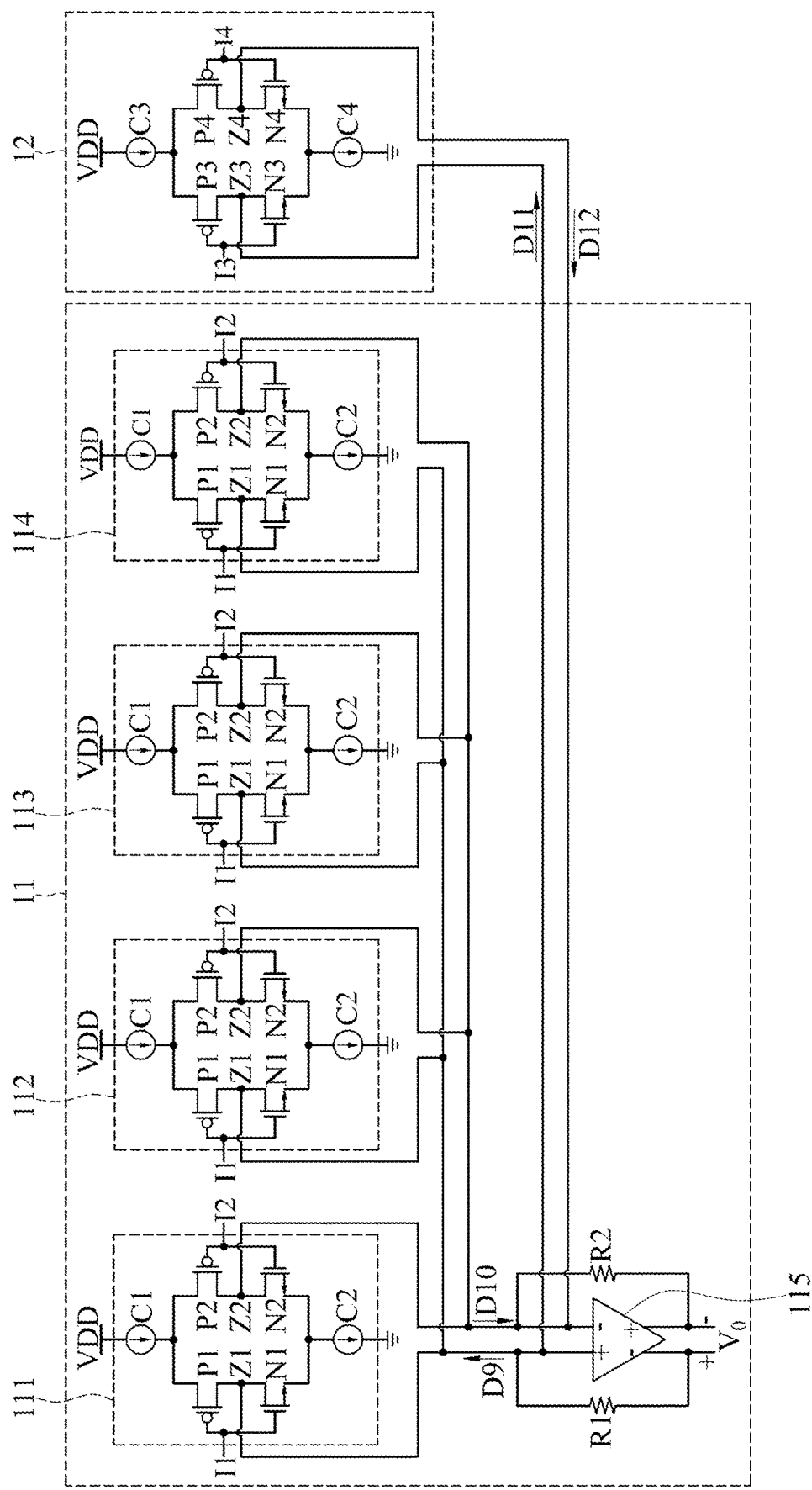
FIG. 4 is a schematic circuit diagram of an embodiment in which the digital-to-analog converter of FIG. 1 operates in a first cycle.

In some embodiments, for example, the current unit of the compensation circuit 12 may have the same circuit structure as each of the current units 111-114. In the first cycle, the compensation circuit 12 may perform digital-to-analog conversion according to one of the bits of the digital data signal D, so that the output terminal of the amplifier circuit 115 generates a corresponding analog data signal A. In detail, as shown in FIG. 4, the input terminal I3 of the compensation circuit 12 may receive one of the bits of the digital data signal D and generate corresponding data currents D11, D12 flowing through the feedback resistor R1, R2 in the first cycle, to form a voltage drop on the feedback resistor R1, R2. In addition, the input terminals I1 of the current units 111-114 of the digital-to-analog conversion circuit 11 receive others of bits of the digital data signal D to form a current path of a data current D9, D10 flowing through the feedback resistor R1, R2, so that the digital-to-analog conversion circuit 11 generates an analog data signal A according to a total voltage drop formed on the feedback resistors R1, R2. As shown in FIG. 4, the data currents D9, D10 are respectively a current flowing into each of the connection points Z1 of the current units 111-114 and a current flowing out of each of the connection points Z2 of the current units 111-114. The data currents D11, D12 are respectively a current flowing into the connection point Z3 of the compensation circuit 12 and a current flowing out of the connection point Z4 of the compensation circuit 12.

For example, as shown in FIG. 5, three digital data signals D[1]-D[3] generated by a data weighted averaging (DWA) technology each having five bits are given by way of example. D[1]-D[3] may be respectively 5'b10001, 5'b 01101, and 5'b 11011. Referring to FIG. 2 to FIG. 4 together, in the first one of first cycles, the input terminals I1 of the current units 111-114 respectively receive a first bit "1", a second bit "0", a third bit "0", and a fourth bit "0" of the digital data signal D[1], the input terminal I3 of the compensation circuit 12 receives a fifth bit (that is, "1") of the digital data signal D[1], and the current units 111-114 and the compensation circuit 12 generate data currents D9, D11, and transfer the data currents through the feedback resistors R1. In addition, the input terminals I2 of the current units 111-114 receive inverted signals of the digital data signal D[1], that is, the input terminals I2 of the current units 111-114 and the input terminal I4 of the compensation circuit 12 respectively receive "0", "1", "1", "1", and "0", and the current units 111-114 and the compensation circuit 12 generate data currents D10, D12, and transfer the data currents through the feedback resistors R2. According to a total voltage drop generated on the feedback resistors R1, R2 through the digital-to-analog conversion of the five bits of the digital data signal D[1], the output terminal of the amplifier circuit 115 generates an analog data signal A corresponding to the digital data signal D[1].

In the second one of the first cycles, the input terminals I1 of the current units 111-114 respectively receive a first bit "0", a second bit "1", a third bit "1", and a fourth bit "0" of the digital data signal D[2], the input terminal I3 of the compensation circuit 12 receives a fifth bit "1" of the digital data signal D[2], and the current units 111-114 and the compensation circuit 12 generate data currents D9, D11, and transfer the data currents through the feedback resistors R1. In addition, the input terminals I2 of the current units 111-114 receive inverted signals of the digital data signal D[2], that is, the input terminals I2 of the current units 111-114 and the input terminal I4 of the compensation circuit 12 respectively receive "1", "0", "0", "1", and "0", and the current units 111-114 and the compensation circuit 12 generate data currents D10,D12, and transfer the data currents through the feedback resistors R2. According to a total voltage drop generated on the feedback resistors R1, R2 through the digital-to-analog conversion of the five bits of the digital data signal D[2], the output terminal of the amplifier circuit 115 generates an analog data signal A corresponding to the digital data signal D[2]. In the third one of the first cycles, the input terminals I1 of the current units 111-114 respectively receive a first bit "1", a second bit "1", a third bit "0", and a fourth bit "1" of the digital data signal D[3], the input terminal I3 of the compensation circuit 12 receives a fifth bit "1" of the digital data signal D[3], and the current units 111-114 and the compensation circuit 12 generate data currents D9, D11, and transfer the data currents through the feedback resistors R1. In addition, the input terminals I2 of the current units 111-114 receive inverted signals of the digital data signal D[3], that is, the input terminals I2 of the current units 111-114 and the input terminal I4 of the compensation circuit 12 respectively receive "0", "0", "1", "0", and "0", and the current units 111-114 and the compensation circuit 12 generate data currents D10, D12, and transfer the data currents through the feedback resistors R2. According to a total voltage drop generated on the feedback resistors R1, R2 through the digital-to-analog conversion of the five bits of the digital data signal D[3], the output terminal of the amplifier circuit 115 generates an analog data signal A corresponding to the digital data signal D[3]. Based on this, by virtue of the compensation circuit 12, the digital-to-analog converter 1 can process digital-to-analog conversion of a larger number of bits.

In some embodiments, the compensation input signal S1 may be combined with the reset signal RZ corresponding to the first reset level L1 to form another reset signal RZ corresponding to the second reset level L2, so that the another reset signal RZ corresponding to the second reset level L2 may include the same number of bits as the digital data signal D, and the another reset signal RZ may include two reset signals RZA, RZB (which are referred to as a first reset signal RZA and a second reset signal RZB below) having the same number of bits. The compensation circuit 12 may successively generate compensation currents S21, S22 according to one of the bits of the reset signals RZA, RZB, and the digital-to-analog conversion circuit 11 performs two times of return-to-zero conversion (which are referred to as first return-to-zero conversion and second return-to-zero conversion below) according to other of bits of the reset signals RZA, RZB in the second cycle.

In detail, as shown in FIG. 5, the digital data signals D[1]-D[3] and the reset signals RZA, RZB corresponding to the second reset level L2 each have five bits, and the reset signals RZA, RZB may be respectively 5'b11001 and 5'b00111. First four bits of each of the reset signals RZA, RZB correspond to the first reset level L1, that is, the first four bits of the first reset signal RZA and the compensation input signal S1 having a logic level of "1" may be combined into another first reset signal RZA having five bits, so that the another first reset signal RZA corresponds to the second reset level L2 The first four bits of the second reset signal RZB and the compensation input signal S1 having a logic level of "1" may be combined into another second reset signal RZB having five bits, so that the another second reset signal RZB corresponds to the second reset level L2. Referring to FIG. 2, FIG. 3, and FIG. 5 together, during first return-to-zero conversion in the second cycle, the input terminals I1 of the current units 111-114 receive a first bit "1", a second bit "1", a third bit "0", and a fourth bit "0" of the first reset signal RZA (that is, the current units 111-114 perform the first zero-return conversion according to the corresponding first reset level L1 to reset the analog data signal A), to form voltage drops corresponding to the four bits of the first reset signal RZA (that is, the first reset level L1) on the feedback resistors R1, R2, and the input terminal I3 of the compensation circuit 12 receives a fifth bit "1" of the first reset signal RZA and generates compensation currents S21, S22, to further form voltage drops (that is, compensation voltages) corresponding to the fifth bit of the first reset signal RZA on the feedback resistors R1, R2, so that the output terminal of the amplifier circuit 115 generates the analog data signal A at the second reset level L2. During second return-to-zero conversion in the second cycle, the input terminals I1 of the current units 111-114 receive a first bit "0", a second bit "0", a third bit "1", and a fourth bit "1" of the second reset signal RZB (that is, the current units 111-114 perform the second zero-return conversion according to the corresponding first reset level L1 to reset the analog data signal A), to form voltage drops corresponding to the four bits of the second reset signal RZB (that is, the first reset level L1) on the feedback resistors R1, R2, and the input terminal I3 of the compensation circuit 12 receives a fifth bit "1" of the second reset signal RZB and generates compensation currents S21, S22, to further form voltage drops (that is, compensation voltages) corresponding to the fifth bit of the second reset signal RZB on the feedback resistors R1, R2, so that the output terminal of the amplifier circuit 115 generates the analog data signal A at the second reset level L2.

In some embodiments, the bits of the reset signals RZA, RZB received by the current units 111-114 have opposite polarities (that is, the reset signals corresponding to the first reset level L1 have opposite polarities). For example, the reset signals RZA, RZB are respectively 5'b11001 and 5'b00111. First to fourth bits of the first reset signal RZA and first to fourth bits of the second reset signal RZB have opposite polarities. In addition, it may be learned from FIG. 5 that, fifth bits of the reset signals RZA, RZB each is "1", and the compensation current S21, S22 can form additional compensation voltages on the feedback resistor R1, R2. In some embodiments, the fifth bits of the reset signals RZA, RZB each is "0".

In some embodiments, a bit number of compensation input signal S1 may also be equal to or greater than two. For example, the bit number of the compensation input signal S1 is two. The compensation input signal S1 may be present in the reset signals RZA, RZB corresponding to the second reset level L2. For example, in the first reset signal RZA, the compensation input signal S1 may be 2'b11, and in the second reset signal RZB, the compensation input signal S1 may be 2'b01. In this case, the compensation circuit 12 may include two current units. The two current units of the compensation circuit 12 may respectively receive 2'b11, 2'b01. The two current units of the compensation circuit 12 respectively generate corresponding compensation currents S21, S22 in the second cycle. Moreover, as described above, the compensation input signal S1 may be present in the reset signals RZA, RZB. Since the compensation input signal S1 has two bits, the reset signals RZA, RZB corresponding to the second reset level L2 each may have six bits, and the compensation input signal S1 is a fifth bit and a sixth bit of each of the reset signals RZA, RZB, that is, the reset signals RZA, RZB may be respectively 2'b110011 and 2'b001101. Based on this, the fifth bit of the first reset signal RZA and a fifth bit of the second reset signal RZB are respectively "1" and "0", and therefore the fifth bit of the first reset signal RZA and the fifth bit of the second reset signal RZB have opposite polarities. According to the fifth bits having opposite polarities, compensation currents generated by the two current units of the compensation circuit 12 may be considered as offsetting each other. The sixth bits of the reset signals RZA, RZB are both "1". According to the sixth bits of both "1", compensation currents generated by the two current units of the compensation circuit 12 do not offset each other. Therefore, the compensation input signals S1 of 2'b11 and 2'b01 may be considered as logic "1", that is, the compensation input signal S1 may be logic "1".

Figure 6:
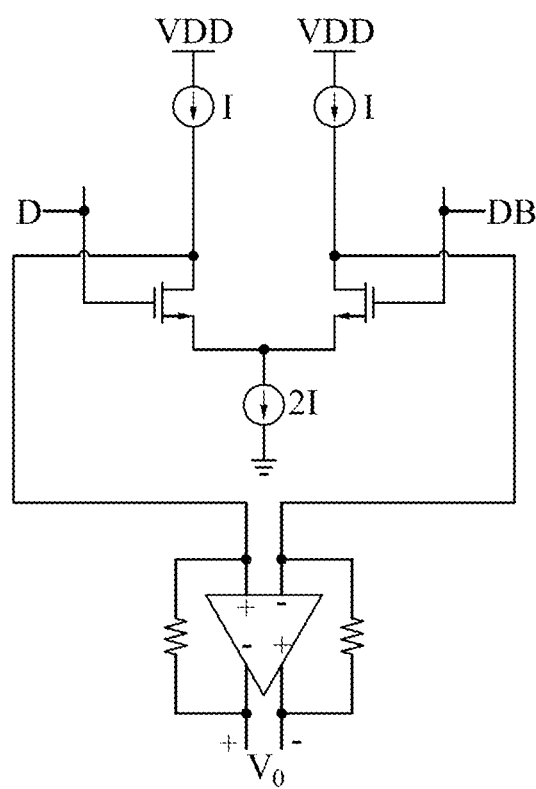
FIG. 6 is a schematic circuit diagram of a current unit of a compensation circuit or a current unit of a digital-to-analog conversion circuit according to an embodiment.

In some embodiments, the current switches in the compensation circuit 12 and the current units 111-114 of the digital-to-analog conversion circuit 11 illustrated in FIG. 2 and FIG. 4 are implemented by complementary N-type transistors and P-type transistors, but the present disclosure is not limited thereto. The current switches in the compensation circuit 12 and the current units 111-114 of the digitalto-analog conversion circuit 11 may also be implemented by NMOS transistors, as shown in FIG. 6, or may be implemented by PMOS transistors.

In some embodiments, values of currents provided by the current sources C1, C2, C3, C4 and resistance values of feedback resistors R1, R2 may be adjusted according to a value of a required compensation voltage. If there is no other factor affecting the offset voltage of digital-to-analog converter 1, the compensation voltage is directly proportional to an idle tone frequency and a reference voltage used by the digital-to-analog converter 1 during digital-to-analog conversion, and the compensation voltage is inversely proportional to a signal sampling frequency during digital-to-analog conversion. According to the idle tone frequency, the reference voltage, and the signal sampling frequency, a designer of the digital-to-analog converter 1 may calculate the compensation voltage, and then design the corresponding currents provided by the current sources C1, C2, C3, C4 and resistance values of feedback resistors R1, R2 according to the compensation voltage. For example, in the field of the audio products, a designer may design the compensation voltage according to an idle tone frequency of a highest audio value 20 KHz audible to human ears.

Figure 7A:
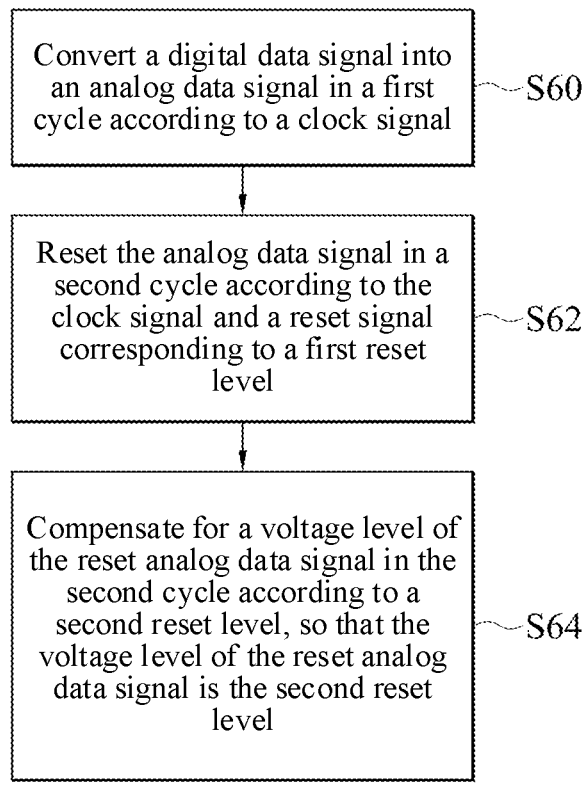
FIG. 7A and FIG. 7B are schematic flowcharts of a digital-to-analog conversion method according to an embodiment.
Figure 7B:
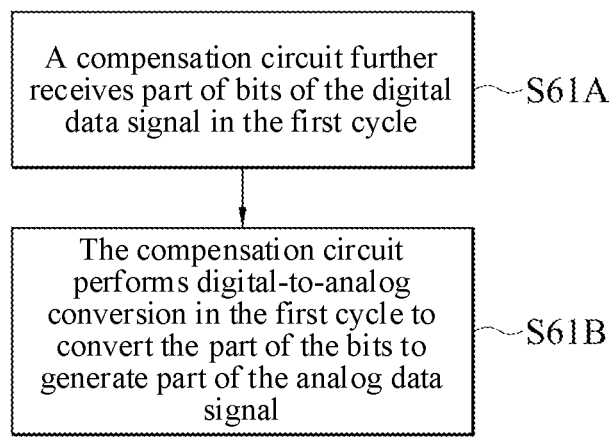

Referring to FIG. 7A and FIG. 7B, FIG. 7A and FIG. 7B are schematic flowcharts of a digital-to-analog conversion method according to an embodiment. Read the figures with FIG. 2 to FIG. 5. The digital-to-analog conversion method includes:

step S60: converting a digital data signal into an analog data signal in a first cycle according to a clock signal;

step S62: resetting the analog data signal in a second cycle according to the clock signal and a reset signal corresponding to a first reset level; and step S64: compensating for a voltage level of the reset analog data signal in the second cycle according to a second reset level, so that the voltage level of the reset analog data signal is the second reset level.

The second reset level is higher or lower than the first reset level.

In some embodiments, step S64 of compensating for the voltage level of the reset analog data signal according to the second reset level is performed by a compensation circuit, and the digital-to-analog conversion method further includes:

step S61A: receiving, by the compensation circuit, part of bits of the digital data signal in the first cycle; and step S61B: performing, by the compensation circuit, digital-to-analog conversion in the first cycle to convert the part of the bits to generate part of the analog data signal.

In some embodiments, step S60 of converting the digital data signal into the analog data signal includes: transferring a current signal through a feedback resistor of an amplifier circuit according to the digital data signal to generate the analog data signal (step S60'). Step S64 of compensating for the voltage level of the reset analog data signal according to the second reset level includes: generating, by the compensation circuit, a compensation current and transferring the compensation current through the feedback resistor in the second cycle according to the second reset level, so that an output terminal of the amplifier circuit generates the analog data signal at the second reset level (step S64').

In some embodiments, step S64' of generating the compensation current includes:

step S640: providing, by a current source, the compensation current in the second cycle; and step S642: turning on a transistor switch in the second cycle according to the second reset level to transfer the compensation current to the feedback resistor.

In some embodiments, the digital-to-analog conversion method further includes:

step S66: providing, by the current source, a data current in the first cycle; and step S68: turning on the transistor switch in the first cycle according to part of bits of the digital data signal to transfer the data current through the feedback resistor in the first cycle to convert the part of the bits to generate part of the analog data signal.

In some embodiments, step S642 of turning on the transistor switch in the second cycle according to the second reset level includes: turning on the transistor switch in the second cycle according to a compensation input signal. The compensation input signal and the reset signal are combined into another reset signal corresponding to the second reset level. In some embodiments, a logic level of the compensation input signal is 1 or 0.

In some embodiments, the reset signal includes a first reset signal and a second reset signal that have opposite polarities and the same number of bits, the compensation input signal and the first reset signal are combined into another first reset signal corresponding to the second reset level, and the compensation input signal and the second reset signal are combined into another second reset signal corresponding to the second reset level.

In some embodiments, step S64 of compensating for the voltage level of the reset analog data signal according to the second reset level includes:

step S646: generating a compensation current in the second cycle according to the second reset level; and step S648: generating a compensation voltage according to the compensation current, so that the voltage level of the reset analog data signal is the second reset level.

In some embodiments, step S64 of compensating for the voltage level of the reset analog data signal according to the second reset level is performed by a compensation circuit, and the digital-to-analog conversion method further includes: generating, by the compensation circuit, a data current in the first cycle according to part of bits of the digital data signal to generate part of the analog data signal.

In conclusion, according to some embodiments of the digital-to-analog converter of the present disclosure, the digital-to-analog conversion circuit additionally generates the reset analog data signal according to the compensation voltage corresponding to the compensation current during the return-to-zero conversion, so that the analog data signal is at a relatively high reset level. In this way, the analog data signal A has an offset voltage. When the digital-to-analog converter is applied to an audio product, an idle tone generated by a digital-to-analog converter having a relatively high offset voltage is beyond an audio range audible to human ears (for example, an audio range greater than 20 KHz). In this way, human ears do not hear audio output generated when the audio product receives no audio.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A digital-to-analog converter, comprising:
   a digital-to-analog conversion circuit configured to receive a clock signal, a digital data signal, and a reset signal corresponding to a first reset level, convert the digital data signal into an analog data signal in a first cycle according to the clock signal, and reset the analog data signal in a second cycle according to the clock signal and the first reset level; and
   a compensation circuit coupled to the digital-to-analog conversion circuit and configured to compensate for a voltage level of the reset analog data signal in the second cycle according to a second reset level, so that the voltage level of the reset analog data signal is the second reset level, wherein the second reset level is higher or lower than the first reset level.

2. The digital-to-analog converter according to claim 1, wherein the compensation circuit is further configured to receive part of bits of the digital data signal in the first cycle and perform digital-to-analog conversion in the first cycle to convert the part of the bits of the digital data signal to part of the analog data signal.

3. The digital-to-analog converter according to claim 1, wherein the digital-to-analog conversion circuit comprises:
   an amplifier circuit comprising an input terminal and an output terminal;
   a feedback resistor coupled between the input terminal and the output terminal;
   a current source configured to provide a current signal; and
   a transistor switch coupled to the current source and configured to be turned on or turned off according to the digital data signal and transfer, when turned on, the current signal through the feedback resistor, so that the output terminal generates the analog data signal.

4. The digital-to-analog converter according to claim 3, wherein the compensation circuit is configured to generate a compensation current in the second cycle, and the compensation current flows through the feedback resistor to compensate for the voltage level of the reset analog data signal, so that the output terminal generates the analog data signal at the second reset level.

5. The digital-to-analog converter according to claim 4, wherein the compensation circuit comprises:
   another current source configured to provide the compensation current in the second cycle; and
   another transistor switch coupled to the another current source and configured to be turned on in the second cycle to transfer the compensation current through the feedback resistor in the second cycle, so that the output terminal generates the analog data signal at the second reset level.

6. The digital-to-analog converter according to claim 5, wherein the another current source is further configured to provide a data current in the first cycle, and the another transistor switch is further configured to be turned on in the first cycle according to part of bits of the digital data signal to transfer the data current through the feedback resistor in the first cycle, so that the compensation circuit performs digital-to-analog conversion in the first cycle to convert the part of the bits of the digital data signal to part of the analog data signal.

7. The digital-to-analog converter according to claim 4, wherein the another transistor switch is configured to be turned on in the second cycle according to a compensation input signal, and the compensation input signal and the reset signal are combined into another reset signal corresponding to the second reset level.

8. The digital-to-analog converter according to claim 7, wherein a logic level of the compensation input signal is 1.

9. The digital-to-analog converter according to claim 7, wherein the reset signal comprises a first reset signal and a second reset signal that have opposite polarities and the same number of bits, the compensation input signal and the first reset signal are combined into another first reset signal corresponding to the second reset level, and the compensation input signal and the second reset signal are combined into another second reset signal corresponding to the second reset level.

10. The digital-to-analog converter according to claim 1, wherein the compensation circuit comprises:
    a current source configured to provide a compensation current in the second cycle; and
    a transistor switch coupled to the current source and configured to be turned on in the second cycle according to a compensation input signal and transfer, when turned on, the compensation current to the digital-to-analog conversion circuit, so that the digital-to-analog conversion circuit generates a compensation voltage to cause the voltage level of the reset analog data signal to be equal to the second reset level.

11. The digital-to-analog converter according to claim 10, wherein the current source is further configured to provide a data current in the first cycle, and the compensation circuit is further configured to be turned on in the first cycle according to part of bits of the digital data signal and transfer, when turned on, the data current to the digital-to-analog conversion circuit, so that the digital-to-analog conversion circuit generates the analog data signal.

12. A digital-to-analog conversion method, comprising:
    converting a digital data signal into an analog data signal in a first cycle according to a clock signal;
    resetting the analog data signal in a second cycle according to the clock signal and a reset signal corresponding to a first reset level; and
    compensating for a voltage level of the reset analog data signal in the second cycle according to a second reset level, so that the voltage level of the reset analog data signal is the second reset level; wherein
    the second reset level is higher or lower than the first reset level.

13. The digital-to-analog conversion method according to claim 12, wherein the step of compensating for the voltage level of the reset analog data signal according to the second reset level is performed by a compensation circuit, and the digital-to-analog conversion method further comprises:
    receiving, by the compensation circuit, part of bits of the digital data signal in the first cycle; and
    performing, by the compensation circuit, digital-to-analog conversion in the first cycle to convert the part of the bits of the digital data signal to part of the analog data signal.

14. The digital-to-analog conversion method according to claim 12, wherein the step of converting the digital data signal into the analog data signal comprises:
    transferring a current signal through a feedback resistor of an amplifier circuit according to the digital data signal to generate the analog data signal; and
    the step of compensating for the voltage level of the reset analog data signal according to the second reset level comprises:

generating, by the compensation circuit, a compensation current in the second cycle according to the second reset level and transferring the compensation current through the feedback resistor, so that an output terminal of the amplifier circuit generates the analog data signal at the second reset level.

15. The digital-to-analog conversion method according to claim 14, wherein the step of generating the compensation current comprises:
providing, by a current source, the compensation current in the second cycle; and
turning on a transistor switch in the second cycle according to the second reset level to transfer the compensation current to the feedback resistor.

16. The digital-to-analog conversion method according to claim 15, further comprising:
providing, by the current source, a data current in the first cycle; and
turning on the transistor switch in the first cycle according to part of bits of the digital data signal to transfer the data current through the feedback resistor in the first cycle to convert the part of the bits of the digital data signal to part of the analog data signal.

17. The digital-to-analog conversion method according to claim 15, wherein the step of turning on the transistor switch in the second cycle according to the second reset level comprises:
turning on the transistor switch in the second cycle according to a compensation input signal; wherein
the compensation input signal and the reset signal are combined into another reset signal corresponding to the second reset level.

18. The digital-to-analog conversion method according to claim 17, wherein a logic level of the compensation input signal is 1.

19. The digital-to-analog conversion method according to claim 17, wherein the reset signal comprises a first reset signal and a second reset signal that have opposite polarities and the same number of bits, the compensation input signal and the first reset signal are combined into another first reset signal corresponding to the second reset level, and the compensation input signal and the second reset signal are combined into another second reset signal corresponding to the second reset level.

20. The digital-to-analog conversion method according to claim 12, wherein the step of compensating for the voltage level of the reset analog data signal according to the second reset level comprises:
generating a compensation current in the second cycle according to the second reset level; and
generating a compensation voltage according to the compensation current, so that the voltage level of the reset analog data signal is the second reset level.

* * * * *